(12) United States Patent
Sansom et al.

(10) Patent No.: US 7,959,969 B2
(45) Date of Patent: Jun. 14, 2011

(54) FABRICATION OF ANCHORED CARBON NANOTUBE ARRAY DEVICES FOR INTEGRATED LIGHT COLLECTION AND ENERGY CONVERSION

(75) Inventors: Elijah B. Sansom, Los Angeles, CA (US); Morteza Gharib, San Marino, CA (US); Derek Rinderknecht, Arcadia, CA (US)

(73) Assignee: California Institute of Technology, Pasadena, CA (US)

( * ) Notice: Subject to any disclaimer, the term of this patent is extended or adjusted under 35 U.S.C. 154(b) by 3 days.

(21) Appl. No.: 12/291,524

(22) Filed: Nov. 10, 2008

(65) Prior Publication Data

US 2009/0130370 A1     May 21, 2009

Related U.S. Application Data

(63) Continuation-in-part of application No. 11/827,169, filed on Jul. 10, 2007.

(60) Provisional application No. 61/002,706, filed on Nov. 9, 2007.

(51) Int. Cl.
*B05D 5/00*   (2006.01)
*B05D 7/00*   (2006.01)
*B05D 1/38*   (2006.01)
*B05D 3/06*   (2006.01)
*B05D 3/10*   (2006.01)
*B05D 3/12*   (2006.01)
*C01B 31/02*  (2006.01)

(52) U.S. Cl. ........ 427/214; 427/162; 427/271; 427/289; 427/384; 427/386; 427/407.1; 427/535; 977/742; 977/753

(58) Field of Classification Search .................. 427/180, 427/202, 203, 214, 215, 258, 372.2, 384–387, 427/402, 407.1; 423/445 R–445 B; 977/734–753, 977/762–787
See application file for complete search history.

(56) References Cited

U.S. PATENT DOCUMENTS

| | | | |
|---|---|---|---|
| 6,924,335 B2 | 8/2005 | Fan et al. | |
| 7,037,562 B2 | 5/2006 | Jimenez | |
| 7,160,620 B2 | 1/2007 | Huang et al. | |
| 7,183,003 B2 | 2/2007 | Leu et al. | |
| 7,235,442 B2 | 6/2007 | Wang et al. | |
| 7,291,396 B2 | 11/2007 | Huang et al. | |
| 7,393,428 B2 | 7/2008 | Huang et al. | |
| 7,396,477 B2 | 7/2008 | Hsiao | |
| 7,438,844 B2 | 10/2008 | Huang et al. | |
| 7,491,628 B2 | 2/2009 | Noca et al. | |
| 7,534,648 B2 * | 5/2009 | Raravikar et al. | 438/99 |
| 7,569,425 B2 | 8/2009 | Huang et al. | |
| 7,611,628 B1 * | 11/2009 | Hinds, III | 210/500.27 |
| 7,611,651 B2 | 11/2009 | Huang et al. | |
| 2005/0127351 A1 | 6/2005 | Tolt | |
| 2005/0136248 A1 | 6/2005 | Leu et al. | |
| 2005/0167647 A1 | 8/2005 | Huang et al. | |
| 2005/0170169 A1 * | 8/2005 | Watanabe et al. | 428/323 |
| 2005/0230082 A1 | 10/2005 | Chen | |
| 2005/0245659 A1 | 11/2005 | Chen | |
| 2006/0073332 A1 | 4/2006 | Huang et al. | |
| 2006/0073712 A1 | 4/2006 | Suhir | |
| 2006/0118791 A1 | 6/2006 | Leu et al. | |
| 2006/0231970 A1 | 10/2006 | Huang et al. | |
| 2007/0004081 A1 | 1/2007 | Hsiao | |
| 2007/0059864 A1 | 3/2007 | Huang et al. | |
| 2008/0081176 A1 | 4/2008 | Huang et al. | |
| 2008/0145616 A1 | 6/2008 | Gharib et al. | |
| 2009/0032496 A1 | 2/2009 | Yao et al. | |

FOREIGN PATENT DOCUMENTS

| | | |
|---|---|---|
| JP | 2006 114265 A | 4/2006 |
| JP | 2006 164835 A | 6/2006 |
| TW | 253 898 B | 4/2006 |
| TW | 256 877 B | 6/2006 |
| WO | WO 2006/041535 A2 | 4/2006 |

OTHER PUBLICATIONS

Lahiff et al., "Selective Positioning and Density Control of Nanotubes within a Polymer Thin Film," Nano Lett., vol. 3, No. 10, 2003 1333-1337.*
International Preliminay Report on Patentability for PCT/US2008/012641.
Barber, A. H., et al., "Static and dynamic wetting measurements of single carbon nanotubes," Physical review letters 92(18): 186103, 2004.
Correa-Duarte, M.A., et al., "Nanoengineered polymeric thin films by sintering CNT-coated polystyrene spheres," Small 2 (2): 220-224, 2006.
Firowska, I.O., et al., "Highly ordered MWNT-based matrixes: topography at the nanoscale conceived for tissue engineering," Langmuir 22(12): 5427-5434, 2006. Jung, Y.J., et al., "Aligned carbon nanotube-polymer hybrid architectures for diverse flexible electronic applications," Nano letters 6(3): 413-418, 2006.
Mamedov, A. A., et al., "Molecular design of strong single-wall carbon nanotube/polyelectrolyte multilayer composites," Nature materials 1(3): 190-194, 2005.
Melechko, A. V., et al., "Vertically aligned carbon nanofibers and related structures: Controlled synthesis and directed assembly," Journal of applied physics 97(4): 041301, 2005.

(Continued)

*Primary Examiner* — William Phillip Fletcher, III
(74) *Attorney, Agent, or Firm* — Tope-McKay & Associates

(57) ABSTRACT

A method of fabricating optical energy collection and conversion devices using carbon nanotubes (CNTs), and a method of anchoring CNT's into thin polymeric layers is disclosed. The basic method comprises an initial act of surrounding a plurality of substantially aligned nanostructures within at least one fluid layer of substantially uniform thickness such that a first end of the plurality of nanostructures protrudes from the fluid layer. Next, the fluid layer is altered to form an anchoring layer, thereby fastening the nanostructures within the primary anchoring layer with the first ends of the nanostructures protruding from a first surface of the primary anchoring layer. Finally, a portion of the anchoring layer is selectively removed such that a second end of the nanostructures is exposed and protrudes from the anchoring layer. The resulting product is an optically absorbent composite material having aligned nanostructures protruding from both sides of an anchoring layer.

20 Claims, 7 Drawing Sheets

OTHER PUBLICATIONS

Morjan, R.E., et al., "High growth rates and wall decoration of carbon nanotubes grown by plasma-enhanced chemical vapour deposition," Chemical physics letters 383 (3-4): 385-390, 2004.

Ren, Z.F., et al., "Synthesis of large arrays of well-aligned carbon nanotubes on glass," Science 282(5391): 1105-1107, 1998.

Xie, X.L., et al., "Dispersion and alignment of carbon nanotubes in polymer matrix: A review," materials science & engineering. R, Reports 49(4): 89-112, 2005.

Lahiff, E., et al., "Selective positioning and density control of nanotubes within a polymer thin film," Nano letters 3(10): 1333-1337, 2003.

Boo, H., et al., "Electrochemical nanoneedle biosensor based on multiwall carbon nanotube," Analytical chemistry 78(2): 617-620, 2006.

Huber, C.A., et al., "Nanowire array composites," Science 263(5148): 800-802, 1994.

Jin, L., et al., "Alignment of carbon nanotubes in a polymer matrix by mechanical stretching," Applied physics letters 73(9): 1197-1199, 1998.

Li, W.Z., et al., "Large-scale synthesis of aligned carbon nanotubes," Science 274(5293): 1701-1703, 1996.

Ravikar, N. R., et al., "Embedded carbon-nanotube-stiffened polymer surfaces," Small 1(3): 317-320, 2005.

Suh, J.S., and Lee, J.S., "Highly ordered two-dimensional carbon nanotube arrays," Applied physics letters 75(14): 2047-2049, 1999.

Wagner, H.D., et al., "Stress-induced fragmentation of multiwall carbon nanotubes in a polymer matrix," Applied physics letters 72(2): 188-190, 1998.

Wong, E.W., et al., "Nanobeam mechanics: Elasticity, strength, and toughness of nanorods and nanotubes," Science 277(5334): 1971-1975, 1997.

Zhao, L.L., et al., "Porous silicon and alumina as chemically reactive templates for the synthesis of tubes and wires of SnSe, Sn, and $SnO_2$," Angewandte Chemie 45(2): 311-315, 2006.

Nerushev, O.A., et al., "The temperature dependence of Fe-catalysed growth of carbon nanotubes on silicon substrates," Physica. B, Condensed matter 323(1-4): 51-59, 2002.

Huang, X., et al., "Inherent-opening-controlled pattern formation in carbon nanotube arrays," Nanotechnology 18 (2007) 305301 (6pp).

Sansom, E.B., "Experimental Investigation on Patterning of Anchored and Unanchored Aligned Carbon Nanotube Mats by Fluid Immersion and Evaporation," Ph. D. Thesis, California Institute of Technology, Pasadena, California, 2007.

PCT International Search Report and the Written Opinion of the International Searching Authority for PCT/US2007/015754.

PCT International Preliminary Report on Patentability for PCT/US2007/015754.

Creel, C.J., M.A. Lovich, and E.R. Edelman, Arterial paclitaxel distribution and deposition. Circulation Research, 2000. 86(8): p. 879-884.

Scheller, B., U. Speck, C. Abramjuk, U. Bernhardt, M. Bohm, and G. Nickenig, Paclitaxel balloon coating, a novel method for prevention and therapy of restenosis. Circulation, 2004. 110(7): p. 810-814.

Bronikowski, M.J., Longer nanotubes at lower temperatures: The influence of effective activation energies on carbon nanotube growth by thermal chemical vapor deposition. Journal of Physical Chemistry C, 2007. 111(48): p. 17705-17712.

Ajayan, P., Stephan, O., Colliex, C. and Trauth, D., 1994, "Aligned carbon nanotube arrays formed by cutting a polymer resin-nanotube composite," Science 265(5176): 1212-1214.

Boldor, D., Gerbo, N. M., Monroe, W. T., Palmer, J. H., Li, Z. R. and Biris, A. S., 2008, "Temperature measurement of carbon nanotubes using infrared thermography," Chemistry of materials 20(12): 4011-4016.

Borca-Tasciuc, T., Mazumder, M., Son, Y., Pal, S. K., Schadler, L. S. and Ajayan, P. M., 2007, "Anisotropic thermal diffusivity characterization of aligned carbon nanotube-polymer composites," Journal of Nanoscience and Nanotechnology 7(4): 1581-1588.

Choi, T., Poulikakos, D., Tharian, J. and Sennhauser, U., 2005, "Measurement of thermal conductivity of individual multiwalled carbon nanotubes by the 3-omega method," Applied physics letters 87(1): 013108.

Crabtree, G. W. and Lewis, N. S., 2007, "Solar energy conversion," Physics today 60(3): 37-42.

Falvo, M. R., Clary, G. J., Taylor, R. M., Chi, V., Brooks, F. P., Washburn, S. and Superfine, R., 1997, "Bending and buckling of carbon nanotubes under large strain," Nature 389(6651): 582-584.

Fan, S. S., Chapline, M. G., Franklin, N. R., Tombler, T. W., Cassell, A. M. and Dai, H. J., 1999, "Self-oriented regular arrays of carbon nanotubes and their field emission properties," Science 283(5401): 512-4.

Frank, S., Poncharal, P., Wang, Z. L. and de Heer, W. A., 1998, "Carbon nanotube quantum resistors," Science 280(5370): 1744-1746.

Hinds, B. J., Chopra, N., Rantell, T., Andrews, R., Gavalas, V. and Bachas, L. G., 2004, "Aligned multiwalled carbon nanotube membranes," Science 303(5654): 62-5.

Huang, H., Liu, C. H., Wu, Y. and Fan, S. S., 2005, "Aligned carbon nanotube composite films for thermal management," Advanced materials 17(13): 1652.

Iijima, S., 1991, "Helical microtubules of graphitic carbon," Nature 354 (6348): 56-58.

Kam, N. W. S., O'Connell, M., Wisdom, J. A. and Dai, H. J., 2005, "Carbon nanotubes as multifunctional biological transporters and near-infrared agents for selective cancer cell destruction," Proceedings of the National Academy of Sciences of the United States of America 102(33): 11600-11605.

Kim, P., Shi, L., Majumdar, A. and McEuen, P. L., 2001, "Thermal transport measurements of individual multiwalled nanotubes," Physical review letters 87(21): 215502.

Lee, J. U., 2005, "Photovoltaic effect in ideal carbon nanotube diodes," Applied physics letters 87(7): 073101.

Noca, F., Bronikowski, M., Sansom, E. B., Zhou, J. and Gharib, M., 2007, "Nanowicks," NASA Tech Briefs 31(10): 32-3.

Raravikar, N. R., Schadler, L. S., Vijayaraghavan, A. S., Zhao, Y. P., Wei, B. Q. and Ajayan, P. M., 2005, "Synthesis and characterization of thickness-aligned carbon nanotube-polymer composite films," Chemistry of materials 17(5): 974-983.

Sansom, E. B., Rinderknecht, D. and Gharib, M., 2008, "Controlled partial embedding of carbon nanotubes within flexible transparent layers," Nanotechnology 19(3): 035302.

Sethi, S., Ge, L., Ci, L., Ajayan, P. M. and Dhinojwala, A., 2008, "Gecko-inspired carbon nanotube-based self-cleaning adhesives," Nano letters 8(3): 822-825.

Tian, B. Z., Zheng, X. L., Kempa, T. J., Fang, Y., Yu, N. F., Yu, G. H., Huang, J. L. and Lieber, C. M., 2007, "Coaxial silicon nanowires as solar cells and nanoelectronic power sources," Nature 449(7164): 885-8.

Xu, Z., Bai, X. D., Wang, Z. L. and Wang, E. G., 2006, "Multiwall carbon nanotubes made of monochirality graphite shells," Journal of the American Chemical Society 128(4): 1052-1053.

Yang, Z. P., Ci, L. J., Bur, J. A., Lin, S. Y. and Ajayan, P. M., 2008, "Experimental observation of an extremely dark material made by a low-density nanotube array," Nano letters 8(2): 446-451.

Yurdumakan, B., Raravikar, N. R., Ajayan, P. M. and Dhinojwala, A., 2005, "Synthetic gecko foot-hairs from multiwalled carbon nanotubes," Chemical Communications 30: 3799-3801.

Zhou, J., Noca, F. and Gharib, M., 2006, "Flow conveying and diagnosis with carbon nanotube arrays," Nanotechnology 17(19): 4845-4853.

International Search Report and the Written Opinion of the International Searching Authority for PCT/US2008/012641.

\* cited by examiner

FABRICATION OF ANCHORED CARBON NANOTUBE ARRAY DEVICES FOR INTEGRATED LIGHT COLLECTION AND ENERGY CONVERSION

PRIORITY CLAIM

The present application claims the benefit of U.S. Provisional Application No. 61/002,706, filed Nov. 9, 2007; the present application is also a continuation-in-part of prior application Ser. No. 11/827,169, filed Jul. 10, 2007.

BACKGROUND OF THE INVENTION (1) Field of Invention

The present invention relates to the fabrication of nanostructures and, more particularly, to a method of fabricating anchored carbon nanotube arrays into a thin polymeric layer.

(2) Description of Related Art

Solar energy is the only source of energy that can sustainably supply all of humanity's current and expected needs [5]. The primary limitations to its cost-effective use are efficiency in conversion of the available energy to a usable form, such as electricity, the modest energy density available, and infrastructure-related issues such as storage and transmission to mitigate the natural temporal variation in the energy source. Current developments in nanoscale fabrication and technology are showing promise for overcoming these limitations. Approaching the problem of harvesting solar energy, and more generally optical energy, at the nanoscale brings inherent increases in efficiency and decreases in packaging compared to large-scale approaches. Specially designed nanoscale materials are being aggressively pursued as solar cells and power sources [19].

Carbon nanotubes (CNTs) are a well-known nanoscale material, first reported in 1991 [11] and increasingly investigated ever since. CNTs themselves have not shown promise for solar electric application, that is the direct conversion of solar radiation to electricity, due to the fact that multi-walled CNTs behave as ballistic conductors [8], not semiconductors with a suitable bandgap for photovoltaic properties, and the fact that it is quite laborious to fabricate individual diodes which exhibit photovoltaic behavior from single-walled CNTs of the semiconducting variety [14]. This may change, however, as the ability to create monochiral multi-walled CNTs (where all walls within the CNTs have the same chirality) may soon be achieved [20]. These monochiral multi-walled CNTs may be easier to work with and also exhibit desired semiconductor behavior.

Additionally, highly selective growth methods for specific types of semiconducting single-walled CNTs and integration of large numbers of them into photovoltaic devices are under development. In any case, CNTs are promising for solar thermal applications, where solar energy is used for directly heating a working fluid which can then be used in various ways, such as electricity generation by conventional means (induction generators, in "high-temperature systems") or simply as a heat source (so-called "mid-temperature systems").

Substantially vertically aligned CNTs produced by molecular self-assembly in a chemical vapor deposition (CVD) chamber have very recently been shown to be the "darkest material" known to man [21], reflecting three times less light at several visible wavelengths than the previous record-holder. The initial measurements of CNTs in an anchored configuration have shown absorption of greater than about 99.9% of incident light in the continuous wavelength range of 270 nm to 2.6 µm, which includes the entire solar spectrum range, even the near-infrared. For comparison, state-of-the-art receiver coatings for high-temperature solar thermal systems, typically made of a multi-layer cermet structure, absorb about 96% of incident solar light. This extreme optical absorptivity of aligned arrays of CNTs within the solar spectrum makes them very promising as solar absorber materials, and represents a significant improvement over other approaches. There has not previously been a simple and straightforward method for making substantially vertically aligned CNT arrays usable for solar light collection. The previous limitation of having to use CNT arrays along with their growth substrates, usually silicon wafers, made it impractical to make industrial light collection devices based on CNTs. The present invention allows for the use of CNT arrays without their growth substrates, and thus solves the problem of practical use of CNTs for light collection.

A natural consequence of optical energy absorption is its conversion to heat. For example, strong absorption of near-infrared (700-1100 nm) radiation by single-walled CNTs has been used as a potential selective cancer therapy, where the localized heating of the CNTs, but not the surrounding tissue, killed only cells containing the CNTs [12]. In a related study, a modest amount of laser power (390 mW) at a near-infrared wavelength (1064 nm) results in over a 100° C. higher temperature in CNTs than in a carbonaceous graphite control sample [2], further evidencing that CNTs can get very hot by absorbing optical energy. Thus, solar optical energy can be efficiently converted to thermal energy by CNTs, and efficiently conducted along their length to be either utilized directly or transferred into a working fluid.

In addition to record-breaking optical properties, CNTs have some of the highest thermal conductivities known for any material at 650-3000 $Wm^{-1}K^{-1}$ [4] and extreme flexibility [6], which is an important property when considering usable lifetime and assembling industrial components. CNTs can be conveniently and scalably created by direct self-assembly in vertically aligned configurations on planar substrates [7]. The scalable fabrication means they can be produced in large quantities and in areas relevant to industry, without limitations such as being confined to the size of silicon wafers used in semiconductor manufacturing. Vertical alignment of the CNTs combined with their very high thermal conductivity indicates that heat will be efficiently and directionally conducted along their length into the rest of the system where the heat is utilized.

Therefore there exists a continuing need for a simple method of fabrication and use of anchored carbon nanotube array devices for integrated light collection and energy conversion.

(3) Other References Cited

[1] Ajayan, P., Stephan, O., Colliex, C. and Trauth, D., 1994, "Aligned carbon nanotube arrays formed by cutting a polymer resin-nanotube composite," *Science* 265(5176): 1212-1214.

[2] Boldor, D., Gerbo, N. M., Monroe, W. T., Palmer, J. H., Li, Z. R. and Biris, A. S., 2008, "Temperature measurement of carbon nanotubes using infrared thermography," *Chemistry of materials* 20(12): 4011-4016.

[3] Borca-Tasciuc, T., Mazumder, M., Son, Y., Pal, S. K., Schadler, L. S. and Ajayan, P. M., 2007, "Anisotropic thermal diffusivity characterization of aligned carbon nanotube-polymer composites," *Journal of Nanoscience and Nanotechnology* 7(4): 1581-1588.

[4] Choi, T., Poulikakos, D., Tharian, J. and Sennhauser, U., 2005, "Measurement of thermal conductivity of individual multiwalled carbon nanotubes by the 3-omega method," *Applied physics letters* 87(1): 013108.

[5] Crabtree, G. W. and Lewis, N. S., 2007, "Solar energy conversion," *Physics today* 60(3): 37-42.

[6] Falvo, M. R., Clary, G. J., Taylor, R. M., Chi, V., Brooks, F. P., Washburn, S. and Superfine, R., 1997, "Bending and buckling of carbon nanotubes under large strain," *Nature* 389(6651): 582-584.

[7] Fan, S. S., Chapline, M. G., Franklin, N. R., Tombler, T. W., Cassell, A. M. and Dai, H. J., 1999, "Self-oriented regular arrays of carbon nanotubes and their field emission properties," *Science* 283(5401): 512-4.

[8] Frank, S., Poncharal, P., Wang, Z. L. and de Heer, W. A., 1998, "Carbon nanotube quantum resistors," *Science* 280 (5370): 1744-1746.

[9] Hinds, B. J., Chopra, N., Rantell, T., Andrews, R., Gavalas, V. and Bachas, L. G., 2004, "Aligned multiwalled carbon nanotube membranes," *Science* 303(5654): 62-5.

[10] Huang, H., Liu, C. H., Wu, Y. and Fan, S. S., 2005, "Aligned carbon nanotube composite films for thermal management," *Advanced materials* 17(13): 1652.

[11] Iijima, S., 1991, "Helical microtubules of graphitic carbon," *Nature* 354(6348): 56-58.

[12] Kam, N. W. S., O'Connell, M., Wisdom, J. A. and Dai, H. J., 2005, "Carbon nanotubes as multifunctional biological transporters and near-infrared agents for selective cancer cell destruction," *Proceedings of the National Academy of Sciences of the United States of America* 102(33): 11600-11605.

[13] Kim, P., Shi, L., Majumdar, A. and McEuen, P. L., 2001, "Thermal transport measurements of individual multi-walled nanotubes," *Physical review letters* 87(21): 215502.

[14] Lee, J. U., 2005, "Photovoltaic effect in ideal carbon nanotube diodes," *Applied physics letters* 87(7): 073101.

[15] Noca, F., Bronikowski, M., Sansom, E. B., Zhou, J. and Gharib, M., 2007, "Nanowicks," *NASA Tech Briefs* 31(10): 32-3.

[16] Raravikar, N. R., Schadler, L. S., Vijayaraghavan, A. S., Zhao, Y. P., Wei, B. Q. and Ajayan, P. M., 2005, "Synthesis and characterization of thickness-aligned carbon nanotube-polymer composite films," *Chemistry of materials* 17(5): 974-983.

[17] Sansom, E. B., Rinderknecht, D. and Gharib, M., 2008, "Controlled partial embedding of carbon nanotubes within flexible transparent layers," *Nanotechnology* 19(3): 035302.

[18] Sethi, S., Ge, L., Ci, L., Ajayan, P. M. and Dhinojwala, A., 2008, "Gecko-inspired carbon nanotube-based self-cleaning adhesives," *Nano letters* 8(3): 822-825.

[19] Tian, B. Z., Zheng, X. L., Kempa, T. J., Fang, Y., Yu, N. F., Yu, G. H., Huang, J. L. and Lieber, C. M., 2007, "Coaxial silicon nanowires as solar cells and nanoelectronic power sources," *Nature* 449(7164): 885-8.

[20] Xu, Z., Bai, X. D., Wang, Z. L. and Wang, E. G., 2006, "Multiwall carbon nanotubes made of monochirality graphite shells," *Journal of the American Chemical Society* 128(4): 1052-1053.

[21] Yang, Z. P., Ci, L. J., Bur, J. A., Lin, S. Y. and Ajayan, P. M., 2008, "Experimental observation of an extremely dark material made by a low-density nanotube array," *Nano letters* 8(2): 446-451.

[22] Yurdumakan, B., Raravikar, N. R., Ajayan, P. M. and Dhinojwala, A., 2005, "Synthetic gecko foot-hairs from multiwalled carbon nanotubes," *Chemical Communications* 30: 3799-3801.

[23] Zhou, J., Noca, F. and Gharib, M., 2006, "Flow conveying and diagnosis with carbon nanotube arrays," *Nanotechnology* 17(19): 4845-4853.

SUMMARY OF THE INVENTION

The present invention relates to the fabrication of nanostructures and, more particularly, to a method of fabricating carbon nanotube arrays anchored into a thin polymeric layer, and the composite material produced. The present invention comprises an optically absorbent composite material comprising a plurality of substantially aligned nanostructures, each nanostructure having a first end, a second end, and a central region. The composite further comprises a primary anchoring layer having a first surface and a second surface, the primary anchoring layer being attached with the plurality of nanostructures such that the central regions of the plurality of nanostructures are implanted within the primary anchoring layer, the first ends of the plurality of nanostructures protruding from the first surface of the primary anchoring layer, and the second ends of the plurality of nanostructures are protruding from the second surface of the primary anchoring layer.

In another aspect, the material further comprises a secondary anchoring layer having a first surface and a second surface, and having an orientation substantially parallel with the primary anchoring layer, and attached with the plurality of nanostructures such that the second ends of the plurality of nanostructures are embedded in the secondary anchoring layer through the first surface of the secondary anchoring layer.

In yet another aspect, the plurality of nanostructures are embedded in the secondary anchoring layer such that the second ends of the plurality of nanostructures protrude from the second surface of the secondary anchoring layer.

In a further aspect of the composite material of the present invention, the primary and secondary anchoring layers are separated by a distance.

In another aspect of the material, the plurality of substantially aligned nanostructures are selected from a group consisting of carbon nanotubes, nanowires, and nanoparticles.

In yet another aspect, the primary anchoring layer is made of a material selected from a group consisting of a polymer, a metal, an epoxy, and a latex. The material selected for the primary anchoring layer may further contain metal or mineral particles.

In another aspect, the secondary anchoring layer is made of a material selected from a group consisting of a polymer, a metal, an epoxy, and a latex. The material selected for the secondary anchoring layer may further contain metal or mineral particles.

As can be appreciated by one skilled in the art, the present invention further comprises a method for fabricating an optically absorbent composite material. The method comprises an initial act of surrounding a plurality of substantially aligned nanostructures having a first end, a second end, and a central region within at least one fluid layer of substantially uniform thickness such that the fluid layer surrounds the second ends and central regions of the plurality of nanostructures and the first ends of the plurality of nanostructures protrudes from the fluid layer. Next, the fluid layer is altered to form a primary anchoring layer, thereby fastening the nanostructures within the primary anchoring layer with the first ends of the plurality of nanostructures protruding from a first surface of the primary anchoring layer. Finally, a portion of the primary anchoring layer surrounding the second ends of the plurality of nanostructures is selectively removed such that the second ends of the plurality of nanostructures are exposed and protrude from a second surface of the primary anchoring layer. The resulting structure is an embedded nanostructure array where the central regions of the plurality of nanostructures are fastened within the primary anchoring layer, the first ends of the plurality of nanostructures are protruding from a first surface of the primary anchoring layer, and the second ends of the plurality of nanostructures are protruding from a second surface of the primary anchoring layer.

In another aspect, the method of the present invention further comprises an act of forming a secondary anchoring layer by surrounding the second ends of the plurality of substantially aligned nanostructures with a fluid layer of substantially uniform thickness, and altering the fluid layer to form a secondary anchoring layer, thereby fastening the nanostructures within the secondary anchoring layer.

In yet another aspect, the method further comprises an act of selectively removing a portion of the secondary anchoring layer surrounding the second ends of the plurality of nanostructures such that the second ends of the plurality of nanostructures are exposed and protrude from the second surface of the secondary anchoring layer.

In yet another aspect of the method of the present invention, the acts of forming a secondary anchoring layer and selectively removing a portion of the secondary anchoring layer are repeated until a desired number of anchoring layers is formed.

In another aspect of the method, the at least one fluid layer includes a sacrificial layer surrounding the second ends of the plurality of nanostructures.

In a further aspect, selective removal of portions of the anchoring layers is done by a method selected from the group consisting of solvent etching, physical cutting, mechanical polishing, reactive ion etching, plasma etching, and removing a sacrificial layer.

In another aspect, the method further comprises an act of treating the plurality of substantially aligned nanostructures with a plasma prior to surrounding with the fluid layer.

In yet another aspect, the method further comprises an act of the treating the entire composite material with a plasma after fabrication.

In yet another aspect of the method, the plurality of substantially aligned nanostructures are selected from a group consisting of carbon nanotubes, nanowires, and nanoparticles.

In a further aspect, the anchoring layers are made of a material selected from a group consisting of a polymer, a metal, an epoxy, a latex, a polymer, latex, or epoxy containing metal particles, and a polymer, latex, or epoxy containing mineral particles.

BRIEF DESCRIPTION OF THE DRAWINGS

Additional objects and features of the present invention will become more apparent and the disclosure itself will be best understood from the following Detailed Description of the Exemplary Embodiments, when read with reference to the accompanying drawings.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

The preferred embodiments of the present invention described below relate particularly to a method of fabricating optical energy collection and conversion devices based on carbon nanotubes (CNTs), and a method of further anchoring carbon nanotubes into thin polymeric layers. While the description sets forth various embodiment specific details, it will be appreciated that the description is illustrative only and should not be construed in any way as limiting the invention. Furthermore, various applications of the invention, and modifications thereto, which may occur to those who are skilled in the art, are also encompassed by the general concepts described below.

(1) Fabrication of Anchored Nanostructures

Figure 1A:
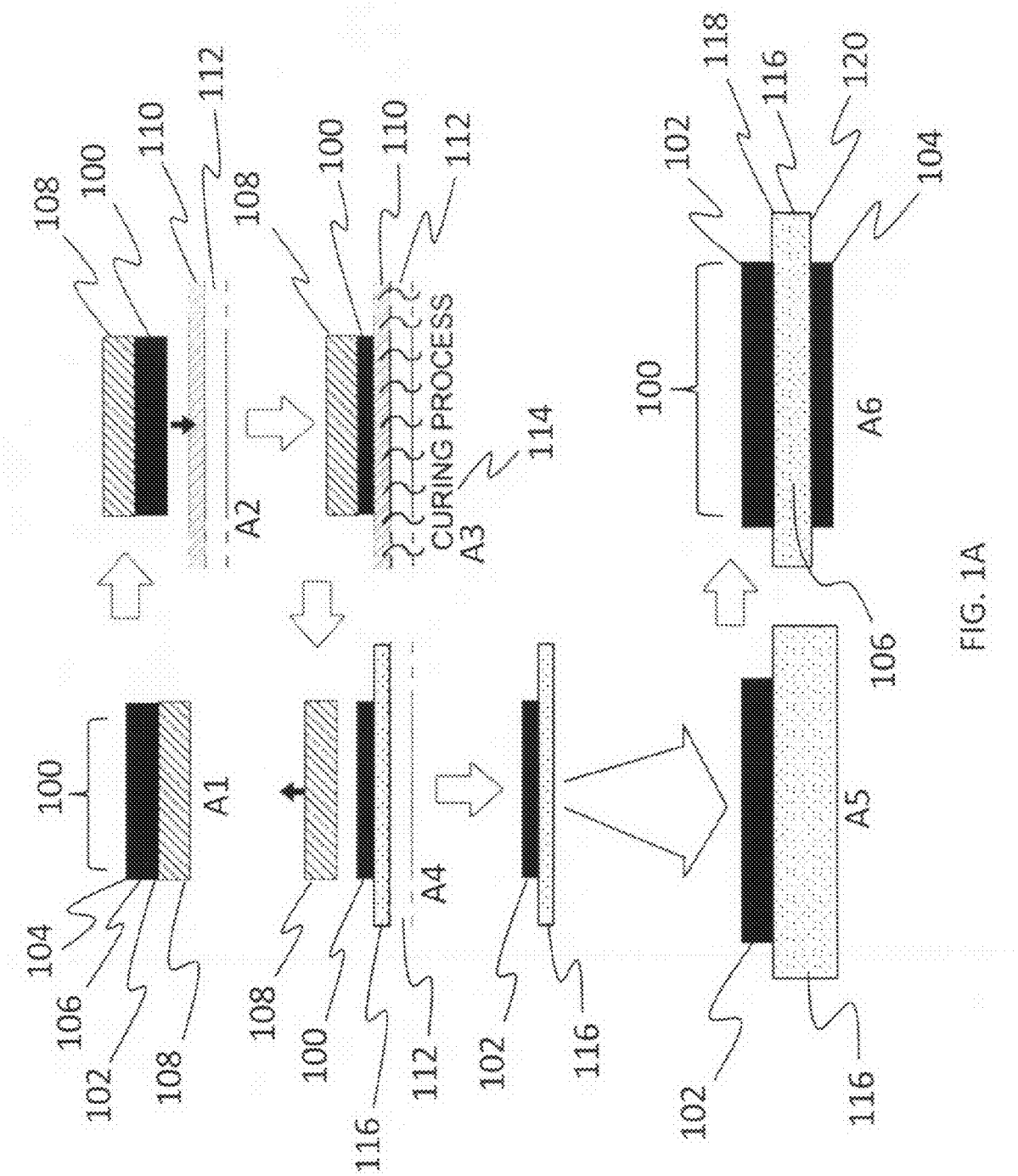
FIG. 1A is a series of illustrations showing the structures produced at each act in the process of fabricating a composite structure with a primary anchoring layer having aligned nanostructures protruding from both sides.

FIG. 1A is a side cross-sectional view of the CNT structures formed during the acts of the primary embedding (anchoring) method of the present invention. In A1, a substantially vertically aligned CNT array 100 having a first end 102, a second end 104, and a central region 106 is grown on a substrate 108, often a properly prepared silicon wafer with or without a silicon dioxide layer and with a catalyst metal deposited on the surface prior to the CNT growth process. CNTs are one type of nanostructure that can be produced and used in this method, but the method is suitable for use with a variety of other nanostructures, such as nanowires and nanoparticles. Alternatively, other chemical vapor deposition methods may be used to fabricate the substantially vertically aligned CNTs 100 on the growth substrate 108, which is well known to one of ordinary skill in the art. In A2, one or more fluid layers 110 with well-controlled thickness and comprised of uncured material is created on a separate substrate 112, possibly by the well-known process of spin-coating. To facilitate the later removal of cured material in order to yield protruding CNT ends, one or more of the fluid layers 110 may be a sacrificial layer, with properties well-suited for enabling easy removal by a process that does not appreciably affect the rest of the assembly. The original CNT growth substrate 108 is manipulated and inverted such that the substantially vertically aligned CNT array 100 may be inserted into the one or more uncured fluid layers 110 such that the second end and central region of the CNTs are surrounded by the fluid layer. In A3, a curing process 114, for example the application of elevated temperature or a specific chemical or optical environment, is applied to the entire assembly comprised of the CNT growth substrate 108, the substantially vertically aligned CNT array 100, the uncured material layer 110, and the uncured material layer substrate 112. The purpose of the curing process is to change the state of the uncured material layer 110 such that it fixes and anchors the substantially vertically aligned CNTs 100 within it, making the material layer into a primary anchoring layer 116. Subsequently, in A4, the growth substrate 108 is lifted off and detached from the substantially vertically aligned CNT array 100, an end of which is now embedded within the anchoring layer 116. In A5, the anchoring layer 116 is detached from the substrate 112, with the substantially vertically aligned CNTs 100 remaining fixed within the anchoring layer 116. This yields a free-standing primary anchoring layer 116 with substantially vertically aligned CNTs 100 anchored within it, with the first ends 102 of the CNTs protruding. A selective removal process is employed to remove part of the primary anchoring layer 110, thereby exposing a previously embedded second end 104 of the CNT's 100 yielding the structure in A6. Non-limiting examples of appropriate selective removal processes are solvent etching, physical cutting, mechanical polishing, reactive ion-etching, plasma etching, and removal of a previously placed sacrificial layer. The result is a composite structure A6 with CNTs 100 protruding from both a first surface 118 and a second surface 120 of the primary anchoring layer 116, with a central region 106 of the CNTs fastened within the primary anchoring layer 116.

Figure 1B:
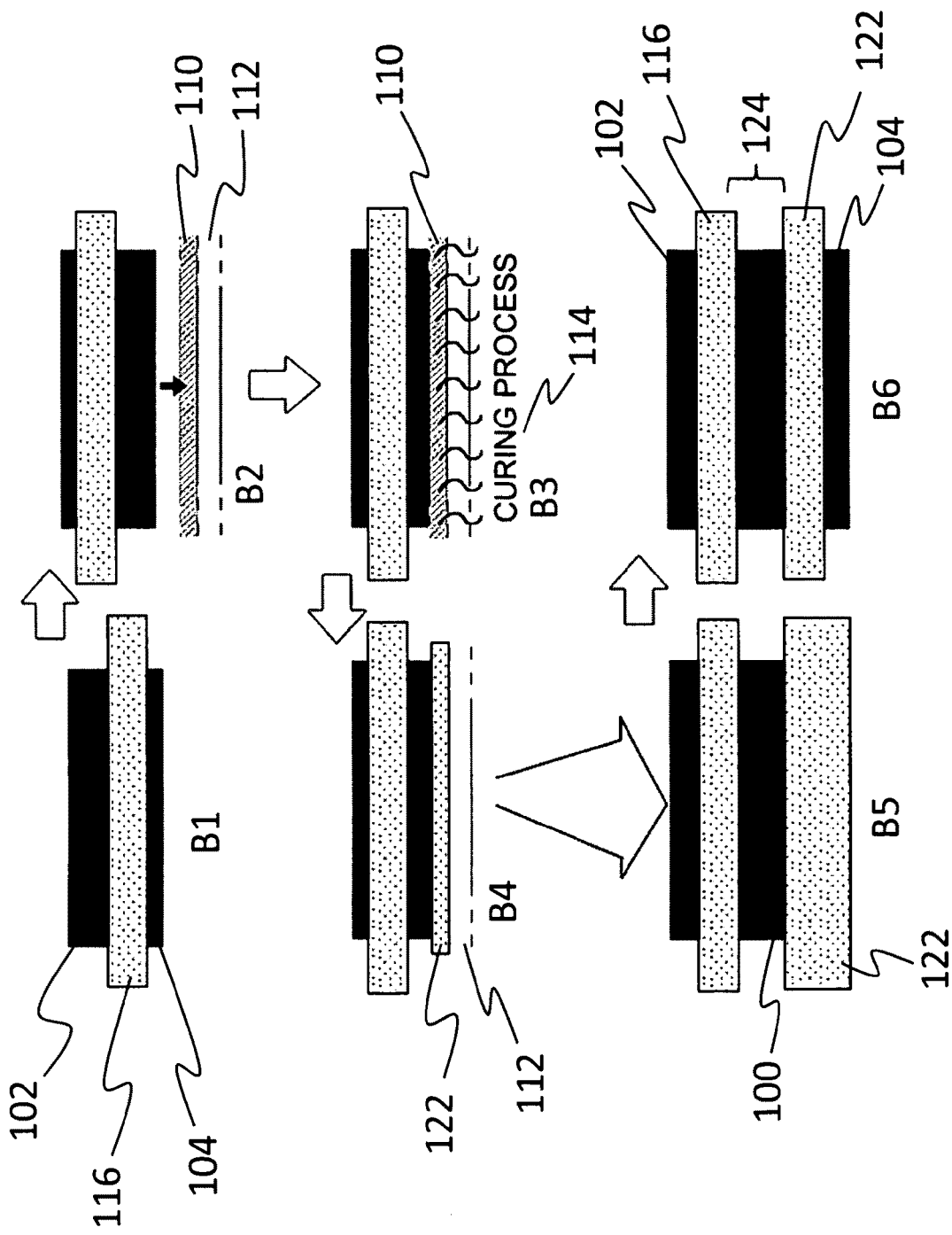
FIG. 1B is a series of illustrations showing the structures produced at each act in adding a secondary anchoring layer to the composite structure of the present invention.

FIG. 1B is a side cross-sectional view of structures formed during the process of adding a secondary anchoring layer to the product A6 of FIG. 1A. Similar to the description for FIG. 1A, the composite material B1 may be manipulated and placed into one or more uncured fluid layers 110 of well-controlled thickness resting on a substrate as in B2. At B3, a curing process 114 may then be applied to the entire assembly to change the state of the uncured fluid layers 110 yielding a secondary anchoring layer 122 as in B4. This secondary anchoring layer 122 may then be detached from the substrate to yield a free-standing composite structure at B5 with the CNT array 100 fully embedded in the secondary anchoring layer 122. From the structure at B5, a selective removal process may then be employed to remove a portion of this secondary anchoring layer 122 such that the second ends 104 of the CNTs protrude from the secondary anchoring layer 122 yielding the structure at B6. It should be noted that the terms "first end" and "second end" of the CNT array are used for orientation purposes only, as the secondary anchoring layer 122 can be fabricated on either end of the CNT array. By controlling the thickness of the first anchoring layer 116 relative to the thickness (height) of the substantially aligned CNT array 100, and also by controlling the thickness of the second anchoring layer 122, a distance 124 (in FIG. 1B) between the first 116 and second 122 anchoring layers may also be controlled. This distance 124 may be as small as zero, such that the two anchoring layers 116 and 122 are adjacent, or may be larger such as similar to the height of the substantially aligned CNTs, which themselves can be a few tens of micrometers up to a millimeter or more in height.

Figure 1C:
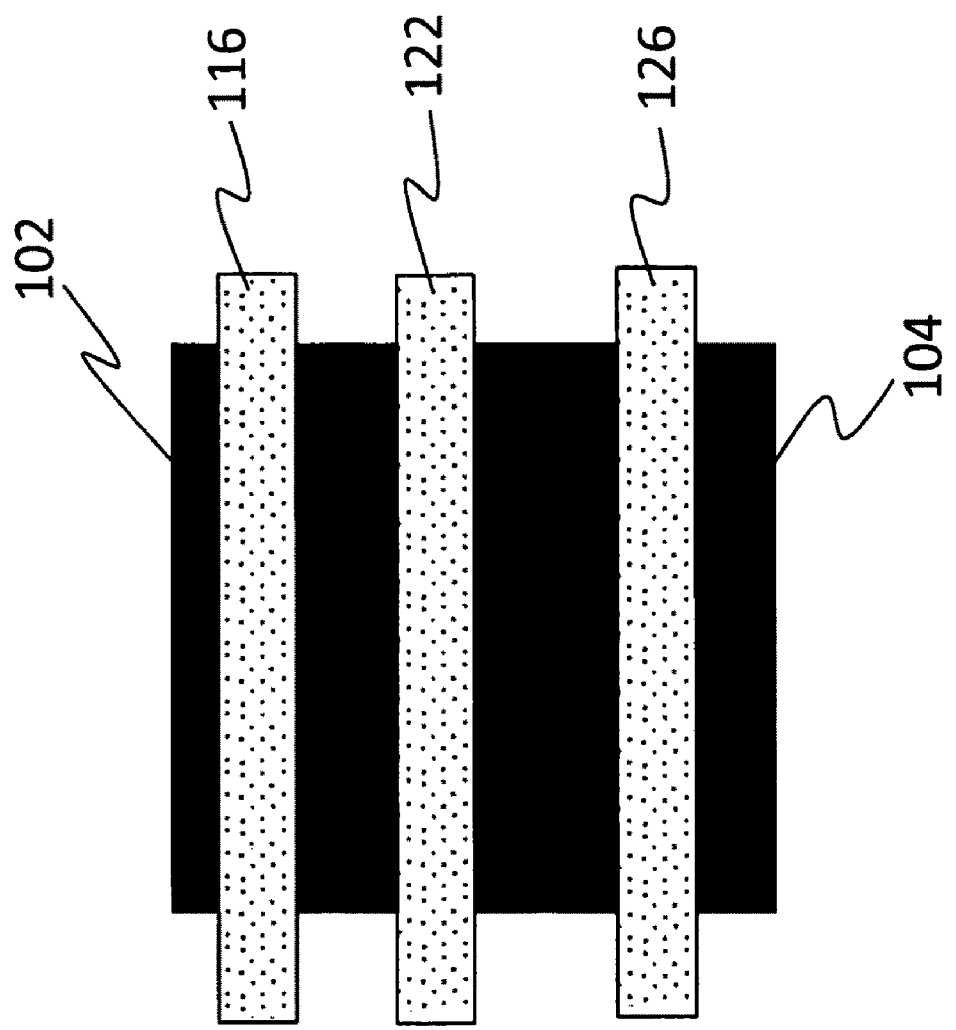
FIG. 1C is an illustration showing a cross-sectional view of a three-tiered composite structure in accordance with the present invention.

FIG. 1C is a side cross-sectional view of the result of yet another application of the process in FIG. 1B. This results in three total anchoring layers 116, 122, and 126, with the ends of the CNTs 102 and 104 protruding from the outermost two anchoring layers 116 and 126. As would be obvious to one of ordinary skill in the art, a stack of many anchoring layers may be produced in this fashion. With control over the thickness of each of the anchoring layers due to the process, the distance between each anchoring layer may also be controlled.

Figure 2:
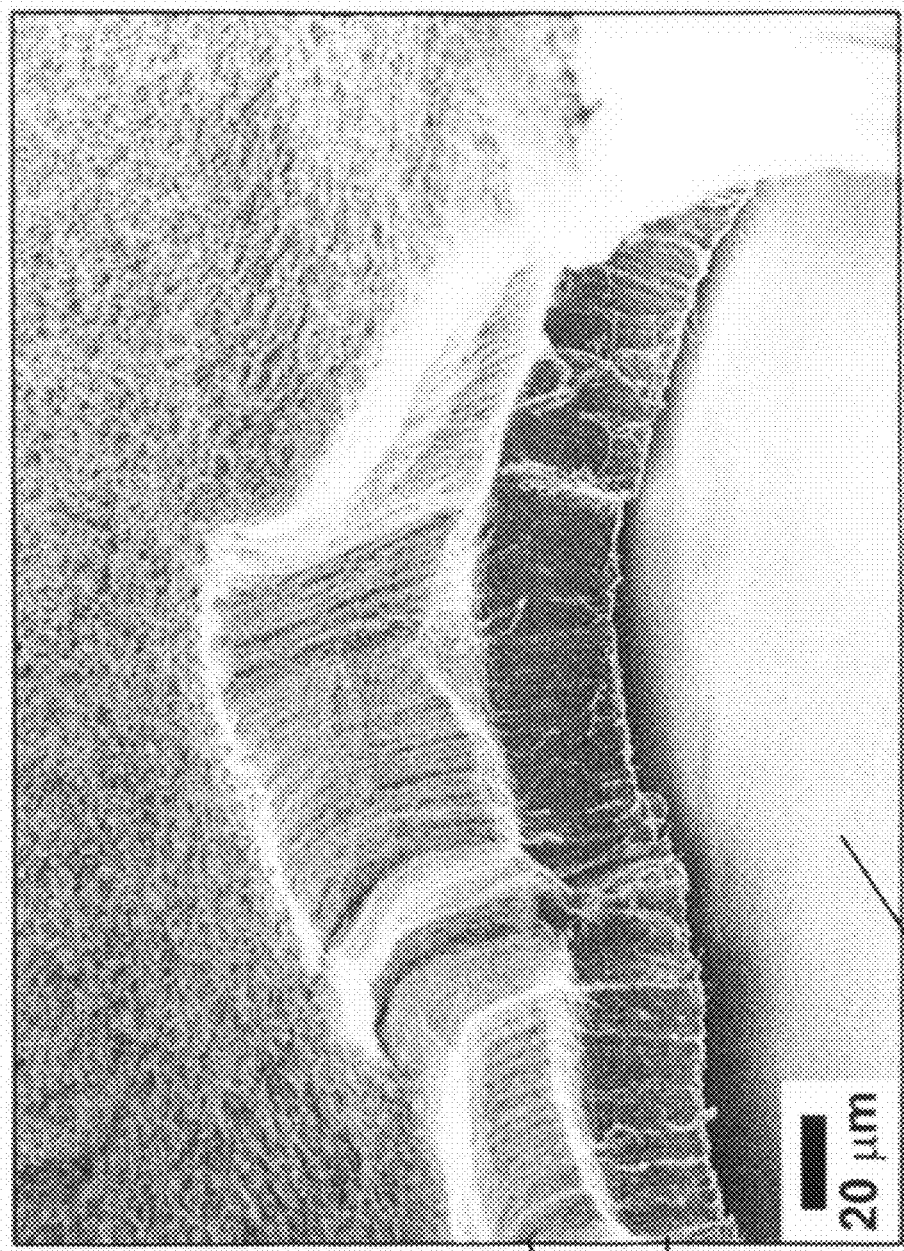
FIG. 2 is a scanning electron microscope photograph showing a perspective view of a substantially vertically aligned CNT array after it has been anchored within a polymer layer and before removal of cured material from the anchoring layer.

FIG. 2 is a scanning electron microscope photograph of an oblique cross-sectional view of a substantially vertically aligned CNT array corresponding to structure A4 in FIG. 1A—the substantially vertically aligned CNT array 100 has been embedded within an anchoring layer (cured polymer) 116 and is resting on a substrate 112. The substantially vertically aligned CNTs 100 extend from the substrate 112 through the cured anchoring layer 116 and their protruding portion 100 is clearly visible above the cured layer 116.

(2) Applications of Anchored Nanostructures

Figure 3:
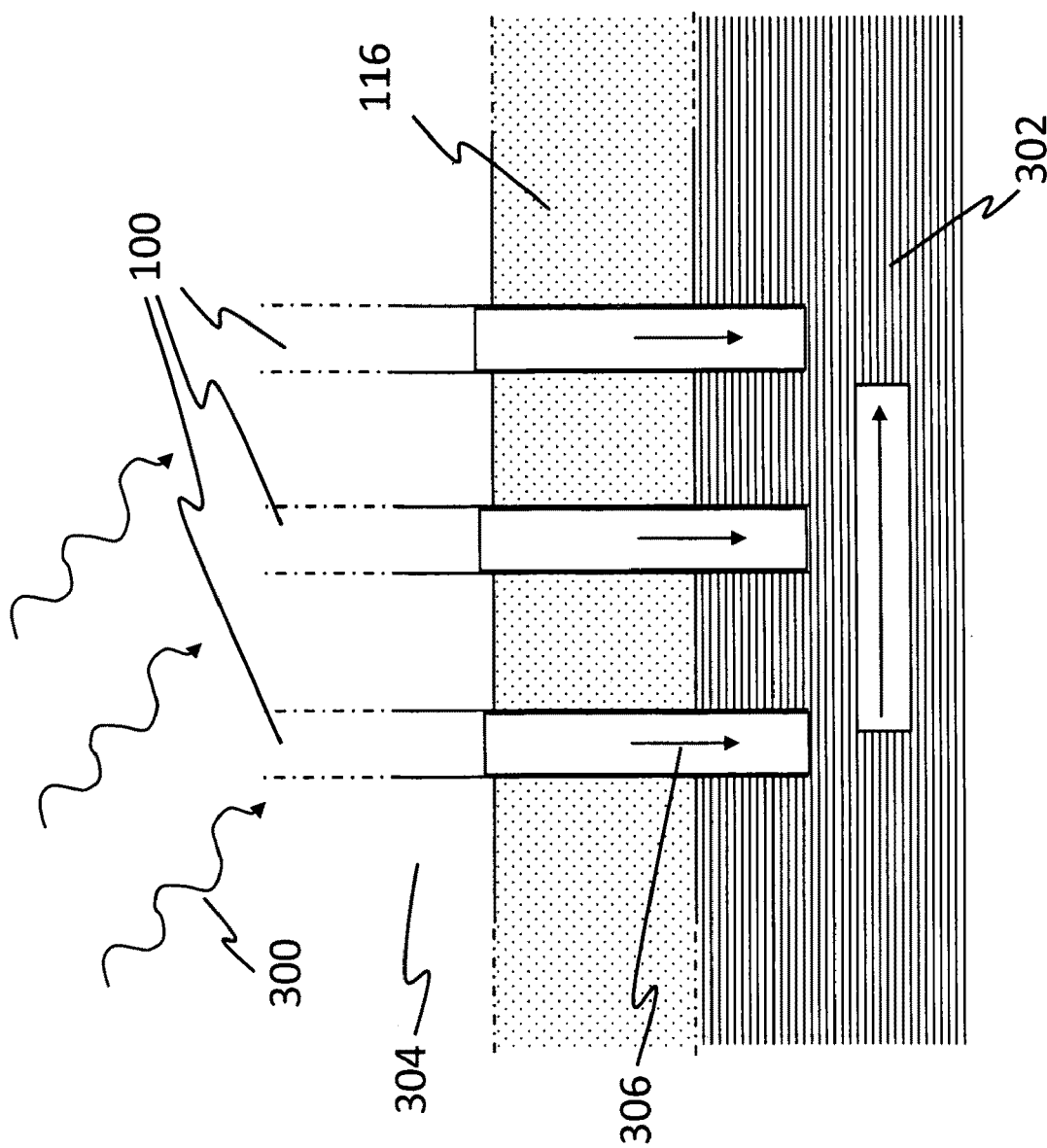
FIG. 3 is an illustration showing a side cross-sectional view of an anchored, substantially vertically aligned CNTs with incident light shining thereon with the CNTs protruding on one side into a working fluid.

FIG. 3 is a side cross-sectional view of an anchored, substantially vertically aligned CNT array 100 with incident light 300 shining thereon, and protruding on a first side into a working fluid 302. The anchoring layer 116 which serves to anchor the CNTs 100 also serves as a fluid barrier confining the working fluid 302 to one side of the layer, and additionally serves to allow convenient handling of the substantially vertically aligned CNTs 100 without actually needing to manipulate them directly. In other words, the anchoring layer 116 may be gripped and manipulated at locations away from the CNTs, but the CNTs which are fixed within the anchoring layer will remain fixed in the anchoring layer even as it is manipulated or moved. The CNTs 100 protrude into free air or some other fluid 304 on the side of the anchoring layer opposite the working fluid 302. As light 300 hits the CNTs 100, it is absorbed as heat and conducted efficiently along the length 306 of the CNTs. Using the disclosed fabrication method, an array of substantially vertically aligned CNTs can also be directly integrated into an anchoring layer which functions as one or more walls of a chamber which confine and control the movement or storage of a working fluid. The polymer-free portions of the CNTs are available for collecting optical energy as heat which is conveniently and efficiently conducted along the CNTs into the working fluid in the chamber. Thus, the overall integrated device serves to collect optical energy and directly transform it to thermal energy stored in a working fluid. Because of the small length scales of the materials involved, the device can easily be less than 100 µm in thickness and of variable active area, or up to millimeters or larger, as substantially vertically aligned CNT arrays can be grown with a height of a millimeter or more.

Not only can the disclosed device be used to conduct thermal energy into a working fluid in an enclosed chamber, but the substantially vertically aligned CNTs themselves may passively propel the fluid in such a chamber by capillary action. Wicking within fibrous or porous materials is a well-known phenomenon—it is the basis for the function of candle wicks and chemical analysis by chromatography—but nanowicking, that is wicking at the nanoscale, has only recently been demonstrated within CNTs [15],[23]. If CNTs are properly integrated within an anchoring layer which is further integrated as part of an enclosed chamber, then the CNT ends will be available and in contact with the working fluid within the enclosed chamber. The interaction of these CNT ends with the fluid will inherently transport the fluid inside the chamber by nanowicking. This would be assisted even further by evaporation and boiling if present, easily achievable in a thin liquid layer, which would create additional liquid interfaces for capillary interactions. Thus, there would be inherent passive fluid transport caused by the presence of the nanostructures.

Figure 4:
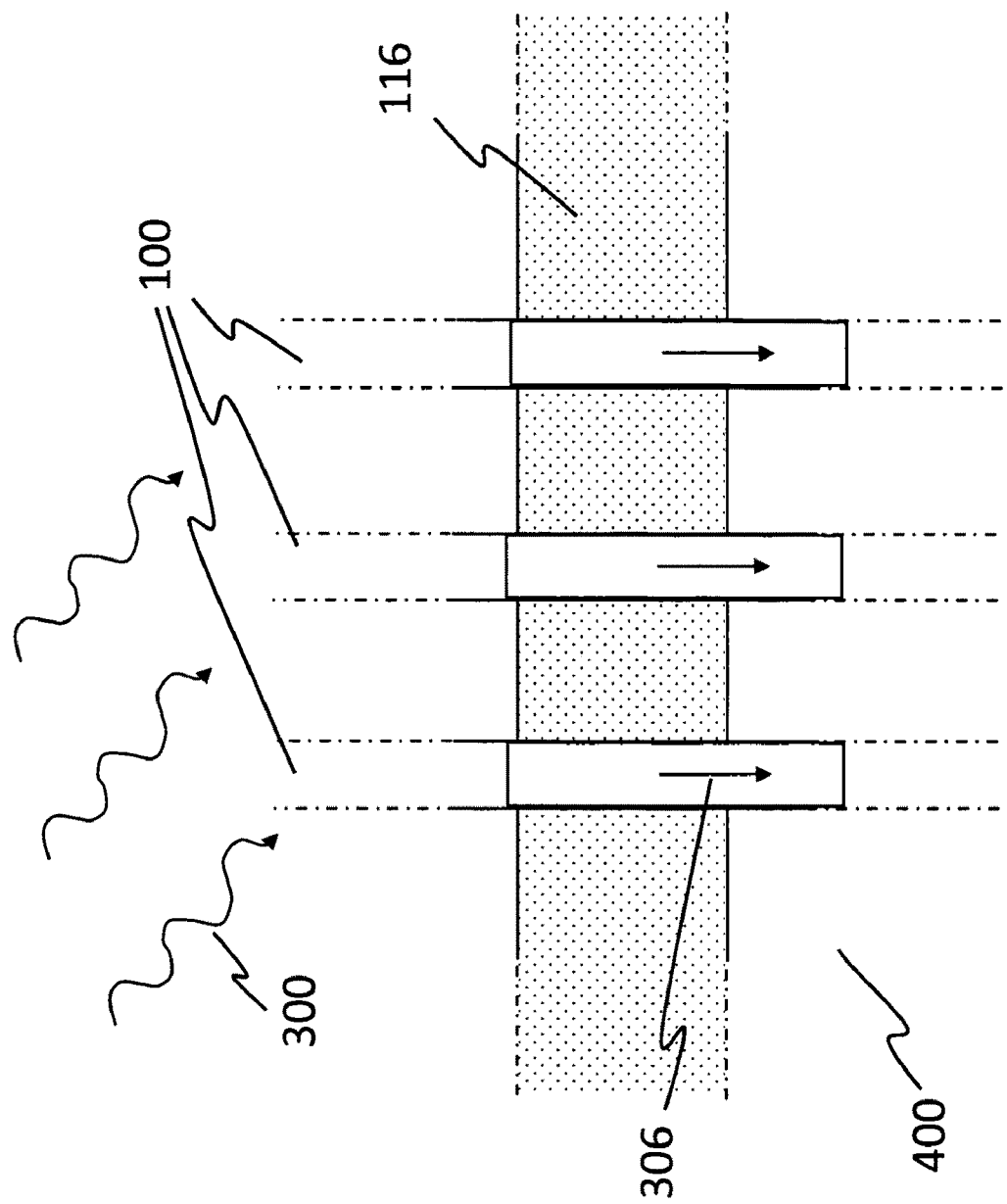
FIG. 4 is an illustration showing a side cross-sectional view of an anchored, substantially vertically aligned CNTs with incident light shining thereon and with the CNTs protruding on one side into air.

FIG. 4 is a side cross-sectional view of incident light 300 on anchored, substantially vertically aligned CNTs 100 which protrude on the second side into air 400. Heat is conducted along the lengths 306 of the CNTs to the other side of the structure. In a similar fashion as in FIG. 3, the substantially vertically aligned CNTs 100 are integrated into the anchoring layer 116 using the disclosed method and are made to protrude from both sides of the anchoring layer. Unlike in FIG. 3, there is no specific working fluid being confined to one side of the anchoring layer. Rather, a structure is made such that a freestanding anchoring layer 116 contains the substantially vertically aligned CNTs 100 which are free to interact with their environment or other structures on both sides of the anchoring layer. The function of collecting optical energy at a first end of the CNTs and conducting the heat along the CNTs to the second end may necessitate the ability to place another material or structure in good thermal contact with the second ends of the CNTs. One way to enable this ability is fabricating the anchored CNT structure such that the distal CNT ends that are intended to make thermal contact are made to protrude from the anchoring layer, as in FIG. 4. Another reason to create the structure this way is for dry adhesion (so-called gecko adhesion) to another surface facilitated by the nanoscale nature of the CNT ends [18]. The basic fabrication method as in FIG. 1A can be applied with the CNT ends protruding to some degree on the second side of the primary anchoring layer.

The structures in both FIG. 3 and FIG. 4 function as an integrated light collection and energy conversion device with sufficient thermal contact to another material or structure that they may not require that CNTs be made to protrude from the second surface of the anchoring layer. Nanostructures with CNTs protruding from both surfaces of an anchoring layer can be produced by various methods. [22] reported that the common organic solvents acetone or toluene preferentially etch polymethylmethacrylate, leaving embedded CNTs intact. Based on the cited results and research on the present invention, the use of a solvent similar to acetone or toluene or the like may etch back the polymer material used in the anchoring layer but leave the substantially vertically aligned CNTs intact. [1] reported that cutting a CNT-polymer composite with a microtome produces CNTs lying on the surface of the composite. Based on the cited results and research on the present invention, the use of a microtome to cut the anchoring layer may produce distal side protrusion of the substantially vertically aligned CNTs. [3] reported that simple mechanical polishing may be used to yield CNTs protruding from the surface of a composite. Based on the cited results and our research, we disclose that mechanical polishing or another mechanical process may be used to control distal side protrusion of substantially vertically aligned CNTs from an anchoring layer. [16] reported that reactive ion etching may be used to preferentially remove polydimethylsiloxane from a CNT-polydimethylsiloxane composite while leaving CNTs intact. Based on the cited results and research on the present invention, reactive ion etching may be used to yield distal side protrusion of substantially vertically aligned CNTs from an anchoring layer. [9] and [10] reported that oxygen plasma can preferentially etch back polystyrene from a CNT-polystyrene composite while leaving CNTs intact. Based on the cited results and research on the present invention, oxygen plasma (or other gas plasma with similar functional properties) may be used to yield distal side protrusion of substantially vertically aligned CNTs from an anchoring layer. In addition to various methods of etching back anchoring layer materials disclosed above, the use of a sacrificial layer is disclosed as a means of achieving distal side protrusion of the substantially vertically aligned CNTs. One layer of material of controlled thickness is first created, then another layer (the anchoring layer in the basic fabrication method) is placed on top of the layer of controlled thickness. CNTs are then placed such that they pierce completely through both layers and the standard curing process is carried out. Finally, the sacrificial layer (underneath the anchoring layer) is removed by a solvent which has no effect on the anchoring layer or the CNTs. The result is that the sacrificial layer is removed, but the CNTs are not, and thus they are protruding from the anchoring layer, which also is not removed.

Figure 5:
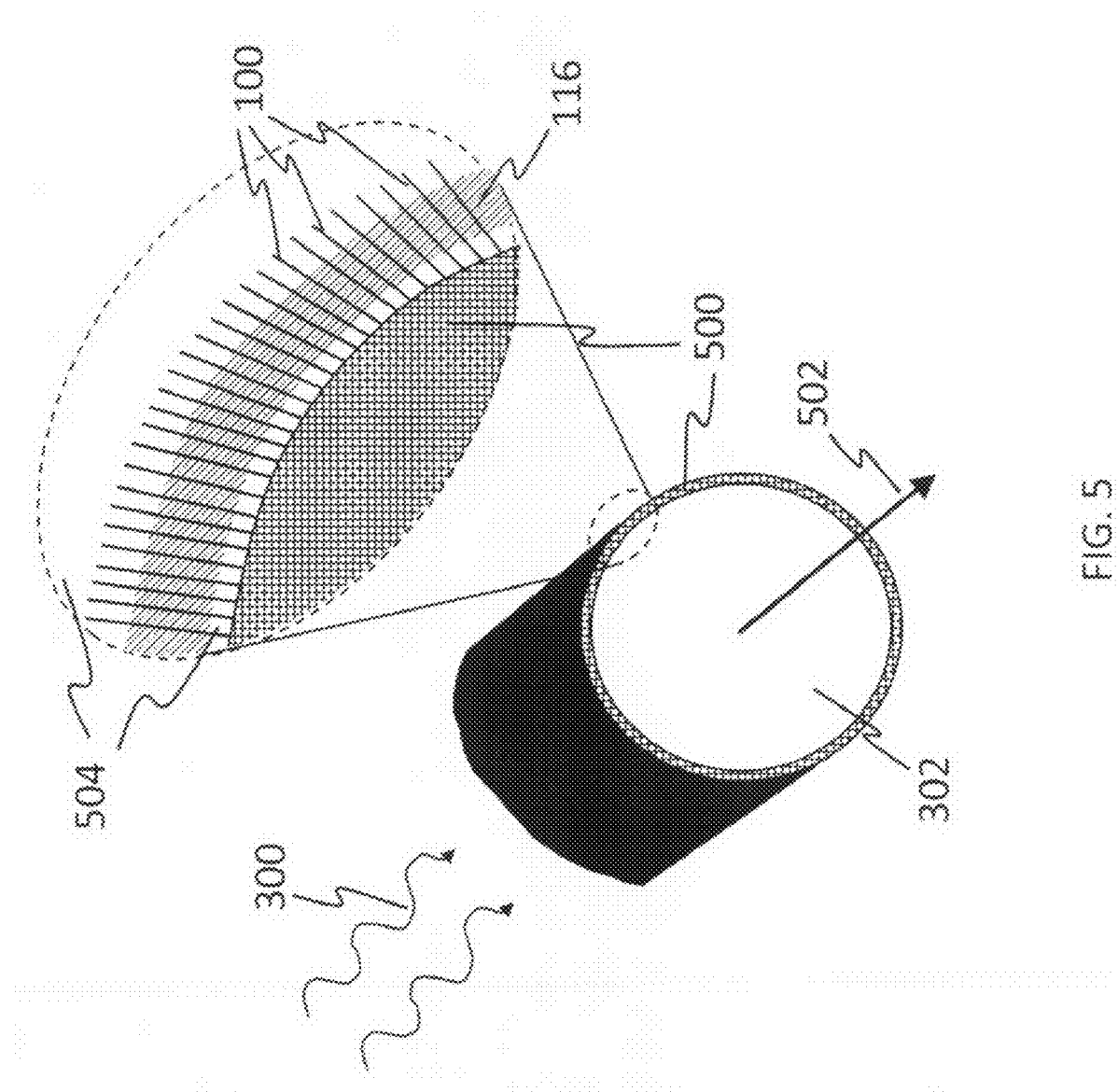
FIG. 5 is an illustration showing an oblique cross-sectional view of a fluid transport structure with anchored, substantially vertically aligned CNTs applied to the surface; the inset shows the CNTs making contact with the surface of the fluid transport structure.

FIG. 5 is an oblique cross-sectional view of a fluid transport structure 500 with anchored, substantially vertically aligned CNTs 100 applied to the surface. The inset shows the CNTs 100 making physical contact with the surface of the fluid transport structure 500. As in FIGS. 3 and 4, light 300 is incident upon and absorbed by the anchored, substantially vertically aligned CNTs 100 and becomes heat. The heat is conducted along the CNTs 100, through the anchoring layer 116, and through the interface with the fluid transport structure wall 500. Thus, the heat has been efficiently and directionally conducted into the fluid transport structure, where it is then absorbed by the working fluid 302 which is flowing 502 within the structure. The CNTs 100 protrude freely into air or the surrounding environment (for example an evacuated space) 504 and they are made to protrude from the inner side of the anchoring layer in order to make good thermal contact by strong dry adhesion with the fluid transport structure 500. Additionally, the anchoring layer 116 may be stretched or forcefully applied to the fluid transport structure 500 to further enable intimate contact with it.

High-temperature (above 200° C. operating temperature) solar thermal systems for electricity generation utilize dark coating materials as the "absorber" layers to collect concentrated solar light and inherently convert it to heat. An improvement of certain efficiency in the absorber material will have significant impact on the total efficiency of the overall system. This is the expected improvement by utilizing anchored CNT layers as the absorber layer in these systems, as the CNTs absorb at least about 99% (could be as high as about 99.9%) of incident solar light while current typical industry absorber layers only absorb 96%. The three main classes of high-temperature systems are dish/engine, parabolic trough, and power tower. Dish/engine systems use a dish design to concentrate solar light, directing the optical energy into a Stirling or Brayton cycle engine for high efficiency conversion to electricity. Typical generation capacities for dish/engine systems are 2-25 kW. Parabolic trough systems utilize parabolic reflectors to focus concentrated solar energy on a line focus.

The linear receiver structures located at the line-focus of the reflectors are built of 4-meter-long sections of stainless steel tube coated by a solar-selective absorber material, and surrounded by an anti-reflective glass tube with the gap between the steel and glass being evacuated and maintained at vacuum. A fluid is heated as it circulates through the interior of the receiver structures and the thermal energy is eventually transferred to steam and turns a turbine for electricity generation. Typical generation capacities for parabolic trough systems are 1-100 MW. Power tower systems are comprised of a field of reflectors, called heliostats, and a central tower where the concentrated solar light is directed. Energy is stored in molten salt and transferred to steam which runs a turbine generator. Typical generation capacities for power tower systems are 30-200 MW.

Because of their extremely high optical absorption and thermal conductivity, anchored CNT materials have high potential for use as the absorber in high-temperature solar thermal systems. This can be done by first fabricating the CNTs, embedding them into the anchoring layer, then optionally removing some of the anchoring layer to expose the other ends of the CNTs for better thermal contact, and finally attaching the anchored CNT material to the fluid transport structure, e.g., a stainless steel tube. If the ends of the CNTs that are to be in contact with the surface of the fluid transport structure are free of anchoring material, they are also free to flex and accommodate surface roughness in the structure, making effective nanoscale contact. This is important for achieving desirable low thermal contact resistance.

Mid-temperature (100-200° C. operating temperature) solar thermal systems are not used for generating electricity, but for steam production. Typically the degree of solar concentration is much less compared to high-temperature systems. The steam generated in a mid-temperature system is used directly as steam, typically in commercial buildings or industrial processes. The basic principles are similar to high-temperature systems, but the need for very high efficiency and maintenance of vacuum levels are less. As in high-temperature systems, anchored CNT materials can also be used as the absorber material in a mid-temperature system with the purpose of generating direct steam.

Because the selection of an anchoring material is independent of the CNT fabrication process itself, any material that can be used in the present fabrication method with CNTs is suitable. For applications requiring a maximum net energy absorption from an optical source such as the sun, i.e., minimizing the loss of energy by thermal emission of infrared radiation, a specially selected anchoring material may be appropriate. Metals have low thermal emission, which is why they are used for thermal blankets in emergencies or following a marathon—they reduce radiative heat loss. Thus, the use of a metallic anchoring layer or a material with similar properties, such as a polymer, latex, or epoxy containing metal particles is a potential option for use in the disclosed invention. Minerals or ceramics, such as alumina, also have special optical properties, and thus may also be utilized in the anchoring layer to tune the behavior of the overall material. Thus, the use of a polymer, latex, or epoxy containing metal particles is a potential option for use in the disclosed invention.

Thus, freestanding anchored CNT array layer structures have very important properties that make them ideal for optical energy collection and conduction into a system, and represent a significant advance over previous absorber layers not made of CNTs and also simple as-grown CNT arrays that are not themselves useful for optical energy collection systems. Regardless of specific application, anchored CNT layers are, in general, an efficient wide-spectrum optical absorption material. Especially because of their freestanding nature, the disclosed CNT layer structures may be applied to any device or structure requiring optical energy absorption and conversion to heat.

One application of the present invention includes the use of water as a working fluid, essentially creating micro-steam engines with light as the energy source, the use of optically transparent cross-linked polydimethylsiloxane (PDMS) (e.g., industry trade name RTV) as the polymer material, and a pressure-driven microfluidic system for controlling and distributing the working fluid. The energy-carrying working fluid, similar to water in a steam engine, can be used to generate electricity or some other form of energy in a downstream process.

Another application involves the use of a microtome or an ultramicrotome or another means to slice the anchored side of the anchored CNT array, with the slice being made flush to the upper surface of the thin polymer layer. Because capillarity caused the uncured polymer to be partially drawn up into the CNT array prior to curing, slicing with a microtome in this way results in the CNT array with the anchored side being somewhat impregnated with polymer, but no polymer layer extending in-plane outside of the CNT array area. Use of such a polymer-containing CNT array gives a minimal functional area for use in devices for optical energy collection and conversion.

Another aspect of the present invention includes oxygen plasma treatment of the CNT array prior to implanting into the polymer layer, such that the CNTs are rendered water wettable and can then be conveniently integrated into a microfluidic device using water as the working fluid. Optionally, oxygen plasma treatment may be used after implanting into the polymer layer, thereby treating the CNT array and the polymeric material itself, which is also beneficial as it leaves all materials in the device water wettable.

Another aspect includes the passive transport (nanowicking) of the working fluid within the chamber by the CNT array ends protruding into the chamber and contacting the fluid. Possibly requiring both microtoming (or similar method) and oxygen plasma treatment to give water wettability, this process will be caused by known capillary effects, and enhanced by evaporation and boiling which increase the available wet-dry interfaces.

Yet another aspect of the present invention is the use of anchored, substantially vertically aligned CNTs, whether with second surface protrusion or not, as optical reference materials (standards) for calibration and use in spectrometers and other optical instruments. Because the absorption of light by CNTs is very high, they are essentially a realization of an ideal optical black body, which is meant to absorb (and emit) all optical radiation upon it. In the field of spectrometric measurement, instruments often must be calibrated against a "black body" prior to the actual measurements of a sample of interest. A typical standard used for this is carbon soot applied to a cavity structure. The disclosed anchored, substantially vertically aligned CNTs may be used as a permanent, reusable, and higher performance replacement of such soot materials. Thus, a preferred embodiment for the disclosed invention is use as an optical standard material.

A further application of the present invention is as an absorber material in a bolometer device or thermal detector for incident electromagnetic radiation (light). A bolometer (also called a thermal detector) is a device for measuring the energy of incident electromagnetic radiation. A bolometer consists of an "absorber" connected to a heat sink (area of constant temperature) through an insulating link. The result is that any radiation absorbed by the absorber raises its temperature above that of the heat sink—the higher the energy absorbed, the higher the temperature will be. Temperature change can be measured directly or via an attached thermometer. Because the anchored, substantially vertically aligned CNTs disclosed herein are a light collection device, and thus may serve as a very effective absorber material in a bolometer.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

What is claimed is:

1. A method for fabricating an optically absorbent composite material comprising the acts of:
   growing a plurality of substantially aligned nanostructures on a growth substrate, the plurality of substantially aligned nanostructures having a first end attached with the growth substrate, a second end, and a central region;
   surrounding the plurality of substantially aligned nanostructures within at least one fluid layer of substantially uniform thickness such that the fluid layer surrounds the second ends and central regions of the plurality of nanostructures and the first ends of the plurality of nanostructures protrude from the fluid layer;

altering the at least one fluid layer to form a primary anchoring layer, thereby fastening the nanostructures within the primary anchoring layer with the first ends of the plurality of nano structures protruding from a first surface of the primary anchoring layer;

detaching the growth substrate from the first ends of the substantially aligned nanostructures; and selectively removing a portion of the primary anchoring layer surrounding the second ends of the plurality of nanostructures such that the second ends of the plurality of nanostructures are exposed and protrude from a second surface of the primary anchoring layer;

whereby the central regions of the plurality of nanostructures are fastened within the primary anchoring layer, the first ends of the plurality of nanostructures are protruding from a first surface of the primary anchoring layer, and the second ends of the plurality of nanostructures are protruding from a second surface of the primary anchoring layer.

2. The method of claim 1, further comprising an act of forming a secondary anchoring layer by:

surrounding the second ends of the plurality of substantially aligned nanostructures with a fluid layer of substantially uniform thickness; and altering the fluid layer to form a secondary anchoring layer, thereby fastening the nanostructures within the secondary anchoring layer.

3. The method of claim 2, further comprising an act of selectively removing a portion of the secondary anchoring layer surrounding the second ends of the plurality of nanostructures such that the second ends of the plurality of nanostructures are exposed and protrude from the second surface of the secondary anchoring layer.

4. The method of claim 3, wherein the acts of forming a secondary anchoring layer and selectively removing a portion of the secondary anchoring layer are repeated until a desired number of anchoring layers is formed.

5. The method of claim 4, wherein the at least one fluid layer includes a sacrificial layer surrounding the second ends of the plurality of nanostructures.

6. The method of claim 5, wherein selective removal of portions of the anchoring layers is done by a method selected from the group consisting of solvent etching, physical cutting, mechanical polishing, reactive ion etching, plasma etching, and removing a sacrificial layer.

7. The method of claim 6, further comprising an act of treating the plurality of substantially aligned nanostructures with a plasma prior to surrounding with the fluid layer.

8. The method of claim 7, further comprising an act of the treating the entire composite material with a plasma after fabrication.

9. The method of claim 8, wherein the plurality of substantially aligned nanostructures are selected from a group consisting of carbon nanotubes, nanowires, and nanoparticles.

10. The method of claim 9, wherein the primary anchoring layer is made of a material selected from a group consisting of a polymer, a metal, an epoxy, and a latex.

11. The method of claim 10, wherein the material selected for the primary anchoring layer contains particles selected from a group consisting of metal particles and mineral particles.

12. The method of claim 11, wherein the second anchoring layer is made of a material selected from a group consisting of a polymer, a metal, an epoxy, and a latex.

13. The method of claim 12, wherein the material selected for the secondary anchoring layer contains particles selected from a group consisting of metal particles and mineral particles.

14. The method of claim 1, wherein the at least one fluid layer includes a sacrificial layer surrounding the second ends of the plurality of nanostructures.

15. The method of claim 1, wherein selective removal of portions of the anchoring layers is done by a method selected from the group consisting of solvent etching, physical cutting, mechanical polishing, reactive ion etching, plasma etching, and removing a sacrificial layer.

16. The method of claim 1, further comprising an act of treating the plurality of substantially aligned nanostructures with a plasma prior to surrounding with the fluid layer.

17. The method of claim 1, further comprising an act of the treating the entire composite material with a plasma after fabrication.

18. The method of claim 1, wherein the plurality of substantially aligned nanostructures are selected from a group consisting of carbon nanotubes, nanowires, and nanoparticles.

19. The method of claim 1, wherein the primary anchoring layer is made of a material selected from a group consisting of a polymer, a metal, and a polymer containing metal particles.

20. The method of claim 19, wherein the material selected for the primary anchoring layer contains particles selected from a group consisting of metal particles and mineral particles.

* * * * *